United States Patent [19]

Fujii

[11] Patent Number: 4,833,101
[45] Date of Patent: May 23, 1989

[54] METHOD OF GROWING QUATERNARY OR PENTANARY ALLOY SEMICONDUCTOR LATTICE-MATCHED TO SUBSTRATE BY MBE

[75] Inventor: Toshio Fujii, Atsugi, Japan

[73] Assignee: Fujitsu Limited, Kawasaki, Japan

[21] Appl. No.: 213,471

[22] Filed: Jun. 29, 1988

Related U.S. Application Data

[63] Continuation of Ser. No. 941,077, Dec. 12, 1986, abandoned.

[30] Foreign Application Priority Data

Dec. 16, 1985 [JP] Japan .................. 60-282492

[51] Int. Cl.$^4$ .................. H01L 21/203; H01L 29/38
[52] U.S. Cl. .................. 437/107; 148/DIG. 65; 148/DIG. 97; 148/DIG. 160; 148/DIG. 169; 156/612; 437/110; 437/111; 437/126; 437/133
[58] Field of Search .................. 29/576 E; 148/1.5, 174, 148/175, DIG. 63, 64, 160, 65, 72, 95, 119, 169; 118/50; 156/610-614; 357/4, 16, 17, 18, 63, 64; 427/87; 437/85, 102, 104, 107, 105, 110, 111, 126, 128, 133

[56] References Cited

U.S. PATENT DOCUMENTS

| | | | |
|---|---|---|---|
| 4,159,919 | 7/1979 | McFee et al. ................... | 148/1.5 |
| 4,261,771 | 4/1981 | Dingle et al. .................. | 148/175 |
| 4,476,477 | 10/1984 | Capasso et al. ............... | 357/16 |
| 4,566,918 | 1/1986 | Irvine et al. .................. | 29/576 E |
| 4,654,090 | 3/1987 | Burnham et al. .............. | 148/175 |
| 4,675,708 | 6/1987 | Onabe ............................ | 357/16 |
| 4,675,709 | 5/1987 | Scifres et al. ................. | 357/17 |

OTHER PUBLICATIONS

Gossard et al., "Epitaxial Structures with Alternate-Atomic-Layer Composition Modulation," Appl. Phys. Lett., vol. 29 No. 6, Sep. 15, 1976, pp. 323–325.
Capasso et al., "Doping . . . Tunable Heterojunction Barrier Heights . . . by Molecular Beam Epitaxy", Appl. Phys. Lett., vol 46 No. 7, Apr. 1, 1985, pp. 664–366.
Sakaki et al., "One Atomic Layer Heterointerface . . . in GaAs-AlAs Quantum Well . . . in Molecular Beam Epitaxy," Jpn. J. Appl. Phys., 24(6), Jun. 1985, pp. L417–L420.
Tanaka et al., "Atomic-Scale . . . Heterointerfaces in GaAs-Al$_x$Ga$_{L-x}$As . . . by Molecular Beam Epitaxy . . ." Jpn. J. Appl. Phys., 25(2), Feb. 1986 pp. L155–L158.

Japanese Journal of Applied Physics, vol. 25, No. 3, Mar. 1986, "MBE Growth of InGaAlAs Lattice-Matched to InP by Pulsed Molecular Beam Method", Fujii et al., pp. L254–L256, *Page L254, paragraphs 3, 5, 6; page L255, paragraph 1*.
Applied Physics Letters, vol. 43, No. 8, Oct. 1983, "Optical Properties of GaInAs/AlInAs Single Quantum Wells", Welch et al., pp. 762–764.
Journal of Crystal Growth, vol. 44, No. 1, Aug. 1978, "Crystal Growth Kinetics In (GaAs)n–(AlAs)m Superlattices Deposited by Molecular Beam Epitaxy", by Petroff et al., pp. 5–13.
Applied Physics Letters, vol. 46, No. 7, Apr. 1985, "GaSb0.5As0.5/Al0.35Ga0.65Sb0.48As0.52 Superlattice Lattice Method Matched to InP Prepared by Molecular Beam Epitaxy", Tsang et al., pp. 659–661.

Primary Examiner—Olik Chaudhuri
Assistant Examiner—William Bunch
Attorney, Agent, or Firm—Staas & Halsey

[57] ABSTRACT

Group III-V multi-alloy semiconductors, such as ternary, quaternary, and pentanary semiconductors, grown on a binary group III-V compound semiconductor substrate, are used as an active layer in opto-devices, high electron mobility transistors, etc. A method of growing multilayers, lattice-matched to the binary substrate and having specific energy band gaps, includes a molecular beam epitaxy (MBE) process. The present invention includes growing a quaternary or pentanary semiconductor layer using a minimum number of effusion cells and eliminating readjustment of molecular beam intensities from one layer to another layer during a series of epitaxial growth steps. As an example of quaternary growth, four effusion cells are utilized and two combinations of three effusion cells are alternately operated, one including an Al effusion cell and the other including a Ga effusion cell. Each of the three effusion cells is capable of growing a ternary semiconductor lattice-matched to the substrate. Two groups of pulsed molecular beams, each pulse having a width corresponding to a growth time less than that required to grow three atomic layers, grow a quaternary alloy semiconductor also lattice-matched to the substrate. Similarly, a method of growing a pentanary alloy semiconductor utilizing five effusion cells in a MBE system can be employed.

14 Claims, 5 Drawing Sheets

METHOD OF GROWING QUATERNARY OR PENTANARY ALLOY SEMICONDUCTOR LATTICE-MATCHED TO SUBSTRATE BY MBE

This is a continuation of co-pending application Ser. No. 941,077 filed on Dec. 12, 1986, now abandoned.

BACKGROUND OF THE INVENTION

1. Field of the Invention

This invention relates to a method of growing a group III-V quaternary or pentanary alloy semiconductor such as InGaAlAs, InGaAlP, InGaAlAsSb, and the like, by a molecular beam epitaxy (hereinafter abbreviated as MBE) process. More particularly, this invention relates to a method of growing a lattice-matched quaternary or pentanary layer on a binary substrate such as InP, GaAs, InAs, and GaSb, or on an epitaxial layer grown thereon, thus forming single or multi-heterostructures.

2. Description of the Prior Art

In a heterostructure having a ternary, quaternary, or pentanary alloy semiconductor grown on a binary substrate or on an epitaxial layer grown thereon, having a different composition, lattice constants of both semiconductors are required to be well matched with each other to obtain high quality epitaxial layers. For example, in a heterostructure in which $GaAs/Al_xGa_{1-x}As$ is grown on a GaAs substrate, the epitaxial layer of $Al_xGa_{1-x}As$ is considered to be lattice-matched to the GaAs substrate for all x values of $0 \leq x \leq 1$. When the lattice constant of the GaAs substrate is represented as $a_{ga}$ and the difference in the lattice constants between GaAs and $Al_xGa_{1-x}As$ is represented as $\Delta a$, then the following condition is maintained for all x values of $0 \leq x \leq 1$:

$$\Delta a/a_{ga} \leq 0.13\%.$$

Therefore, epitaxial growth of the $GaAs/Al_xGa_{1-x}As$ can be obtained having very few crystal defects over the entire range of x values for $Al_xGa_{1-x}As$ semiconductors having different energy band gaps. Therefore, the structure is widely used in photodiodes, lasers, high electron mobility transistors, and the like. In addition, the above-method $GaAs/Al_xGa_{1-x}As$ heterostructure is widely used as a structure for opto-devices operating on a wavelength between 0.6 and 0.9 µm.

In another example, in an active device working on a wavelength within a range of 1.0 to 1.6 µm, a quaternary alloy semiconductor such as $In_{1-(y+z)}Ga_yAl_zAs$ (abbreviated conventionally as InGaAlAs) is often grown on an InP substrate or on a buffer layer of a ternary alloy semiconductor deposited thereon. In this case, the deviation of the lattice constant $\Delta a/a_{ip}$ has a maximum value of 3.5% depending on the values of y and z, wherein $a_{ip}$ denotes a lattice constant of the InP substrate and $\Delta a$ denotes a difference between the lattice constants of InP and $In_{1-(y+z)}Ga_yAl_zAs$.

In the prior art, when the epitaxial layer of a quaternary compound InGaAlAs is grown by MBE forming a heterostructure on an InP substrate, a ternary semiconductor InGaAs, which is lattice-matched with InP, is grown on the substrate, and then a quaternary InGaAlAs, which is also lattice-matched with InP but has a different composition depending on an energy band gap, is grown on the ternary semiconductor. Therefore, a plurality of effusion cells must be provided in the MBE system, each adjusted to generate a specified flux intensity of a molecular beam to grow specified ternary and quaternary epitaxial layers. Each flux intensity is different depending on the composition of the epitaxial layer, even if the same material is utilized as one of the constituents of the epitaxial layers forming the heterostructure.

FIG. 1 is a graph of the flux intensity of each effusion cell versus time in growing a InGaAs/InGaAlAs heterostructure on an InP substrate. In this case, two effusion cells $Ga_1$ and $Ga_2$ for Ga are provided in addition to In, Al and As effusion cells. In FIG. 1, a dash-dot line A shows the instant when the MBE growth is changed from ternary InGaAs to quaternary InGaAlAs. During the growth of the InGaAs layer on the InP substrate, three sources are active. The first is an In cell having a flux intensity shown by line (a), the second is a $Ga_1$ cell having a flux intensity shown by line (b), and the third is an As cell capable of supplying a surplus molecular beam (not shown in FIG. 1).

At the instant shown by line A, a shutter of the cell $Ga_1$ is closed, and shutters of a fourth cell of $Ga_2$ having a flux intensity (b') and a fifth cell of Al having a flux intensity (c) are opened, so that the quaternary InGaAlAs epilayer begin to grow. In FIG. 1, the horizontal dashed lines indicate that the shutter is closed. In a case where another ternary or quaternary semiconductor having a different composition from those mentioned above is to be grown continuously to form a multi-heterostructure, additional effusion cells exclusively used for individual layers are necessary in the subsequent processes. Therefore, plural cells generating molecular beams of the same material but having different flux intensities are needed for MBE growth of a heterostructure including a quaternary or pentanary epitaxial layer, because each layer has to have a different composition. Therefore, many cells must be provided inside the chamber.

It is a difficult matter to accommodate a sufficient number of molecular beam cells in the limited space of a MBE chamber in such a geometric arrangement that each cell faces the substrate surface and is substantially equal distance from the substrate. Therefore, if it is required that the effusion cells be reduced to a minimum number, epitaxial growth must be interrupted by closing all shutters immediately after the first epilayer growth, and adjustments of each MBE cell to another flux intensity level are then executed.

The growth can also be interrupted by readjusting the molecular flux intensity by changing a furnance temperature of the effusion cell or the size of the shutter opening before the following growth. These processes, however, are troublesome and precise control is difficult. As a result, the epitaxial layers deposited tend to have crystal defects due to lattice mismatch and to have energy band gaps which deviate from expected values.

SUMMARY OF THE INVENTION

The present invention relates to an improvement in a method of growing a group III-V quaternary or pentanary semiconductor layer by MBE, lattice-matched with a group III-V substrate.

It is another object of the invention to provide a method of growing a group III-V quaternary or pentanary semiconductor layer by MBE, lattice-matched to the substrate, and having a specified energy band gap, such that the number of effusion cells used in the MBE system is a minimum.

It is still another object of the invention to provide a method of growing quaternary or pentanary semiconductor layers without changing or readjusting the molecular beam intensity during the growing processes for forming heterostructures.

The principal concepts of the present invention are summarized using the characteristics shown in the graph of FIG. 2. In FIG. 2, the lattice constants and energy band gaps of specified binary compound semiconductors are shown at specified points. The lattice constants and energy bandgaps for ternary alloy semiconductors are shown by curves connecting two binary semiconductor points. In FIG. 2, dashed lines show indirect transition regions.

As an example, when a AlGaAs layer is grown on a GaAs substrate, the connecting curve B is a substantially vertical line, therefore lattice constants of the AlGaAs are substantially constant and well lattice-matched to the GaAs substrate even if the composition of the ternary AlGaAs is changed. Therefore, it is quite easy to form an AlGaAs layer on a GaAs substrate because it is only necessary to consider the energy band gap and not lattice-matching.

The data for the mixed crystal (the ternary alloy of GaAs and InAs) $In_{1-x}Ga_xAs$ is plotted by curve A in FIG. 2. When the x value is determined, the lattice constant and energy band gap of the ternary alloy InGaAs are also uniquely determined by a specified point on curve A.

An alloy of binary compounds AlAs and InAs also form a ternary InAlAs alloy semiconductor which is shown by connecting lines C and D.

Point M on curve A corresponds to a composition of $In_{0.53}Ga_{0.47}As$, and point N on line C corresponds to a composition of $In_{0.52}Al_{0.48}As$. These two compositions have substantially equal lattice constants which are also equal to the lattice constant of the InP substrate. Therefore, device quality of these two ternary alloys can be grown free from misfit dislocation on the InP substrate since they are lattice-matched, as shown in FIG. 2. However, points M and N indicate that the InGaAs or InAlAs with various compositions such as $In_{0.4}Ga_{0.6}As$ or $In_{0.3}Al_{0.7}As$ cannot be lattice-matched with the InP substrate. In order to obtain a various value of energy band gap between about 0.7 and 1.5 eV, the use of quaternary semiconductor InGaAlAs is necessary, which permits independent variation of the lattice constant and energy band gap. Therefore, the situation to get desired energy band gaps in InGaAlAs lattice-matched to InP is quite different from that of AlGaAs on GaAs substrate.

The quaternary InGaAlAs, which is an alloy of two ternary semiconductors $In_{0.53}Ga_{0.47}As$ and $In_{0.52}Al_{0.48}As$, also has a lattice constant approximately equal to the InP substrate, and has an energy band gap corresponding to a point determined by the composition ratio of the above-mentioned ternary semiconductors. The energy band gap is located on a line connecting the two points M and N. Therefore, a quaternary semiconductor $In_{1-(y+z)}Ga_yAl_zAs$ (in this case, $y+z=0.47 \sim 0.48$) is lattice-matched with InP and has an energy band gap between approximately 0.7 and 1.5 eV depending on the values of y and Z.

When continuously growing a quaternary semiconductor $In_{1-(y+z)}Ga_yAl_zAs$ on a ternary epilayer by MBE as in the prior art, In, Ga, and Al effusion cells, each have a relative molecular beam intensity of 1-(y+z), y, and z respectively, and an As effusion cell effusing surplus As molecules, are provided. To satisfy the above beam intensity condition, an additional effusion cell for the common elements forming the heterostructure is separately provided when growing the quaternary layer as explained with respect to FIG. 1.

Furthermore, in order to grow a quaternary semiconductor InGaAlAs lattice-matched to an InP substrate at a specific band gap, it is necessary to consider not only the lattice constant but also the energy band gap. Thus, there are two factors which should be considered. This situation is different from that of employing an AlGaAs layer.

The present invention is directed to a new technology for growing quaternary semiconductor layers in which shutters of two groups of effusion cells, each capable of growing respective lattice-matched ternary semiconductors, are opened and closed by pulsing the molecular beams or alternately changing from one set of beams to another. In the case of growing InGaAlAs, two groups of effusion cells are provided including a first group of In, Ga and As cells and a second group of In, Al and As cells, In and Ga being common to both groups. According to the present invention, the energy band gap of the quaternary alloy layer can be easily selected by changing the ratio of the opening time of the cell shutters without having to consider the lattice-match of the layers. The time for each growing process is chosen so that quaternary alloy layers, and not individual ternary layers, are formed. In other words, the time for each growing process is less than the time required for a three atomic layer growth for each process. An atomic layer corresponds to one half of a lattice constant. The lattice constant of the ternary semiconductor $In_{0.53}Ga_{0.47}As$ lattice-matched to InP is known as 5.8686 Å, therefore one atomic layer thereof is equal to 2.9343 Å. And then a three atomic layer growth corresponds to the growth of about 8.8 Å thickness.

Generally, a preferable growth time for each process is that required to grow one monolayer or less than one monolayer for each process.

If the thickness of each composite layer (InGaAs or InAlAs) becomes thicker than that of three atomic layers, each composite layer does not exhibit the properties of a quaternary alloy layer any longer, but exhibits the properties of a superlattice structure.

When growing InGaAlAs lattice-matched to InP, effusion cells of In, Ga and Al having molecular beam flux intensities adjusted to obtain $In_{0.53}Ga_{0.47}As$ and $In_{0.52}Al_{0.48}As$ ternary semiconductors lattice-matched to InP, are provided. In a first method, adjustment can be achieved by fixing molecular beam intensities of In and As at a constant for both ternary semiconductors and adjusting the molecular beam intensities of the Al and Ga cells with respect to the In cell according to the composition of the ternary semiconductors $In_{0.53}Ga_{0.47}As$ and $I_{0.52}Al_{0.48}As$. In a second method, the substrate is subject to alternately pulsed molecular beams of Al and Ga, and continuous molecular beams of In and As. The compositions of y and z of $In_{1-(y+z)}Ga_yAl_zAs$ are controlled by the time ratio of the pulsed molecular beam of Ga and Al. For example, if the opening time of each cell for two ternary compounds is less than the time during which a single atomic ternary layer can be grown and the alternate opening times are equal, InGaAlAs, lattice-matched to InP, having an energy band gap corresponding to a center value between $In_{0.53}Ga_{0.47}As$ and $In_{0.52}Al_{0.48}As$, is formed.

When adjusting the Ga and Al cells, each ternary composition of InGaAs and InAlAs of each alternate MBE process can be lattice-matched to the InP substrate.

When adjusting the time ratio of the alternate opening time of the Ga and Al cell shutters, the band gap of InGaAlAs is selected without having to consider whether it is lattice-matched to the InP substrate. In addition, the Ga and Al beam intensities are not changed but their time ratio is changed. Therefore, the growing quaternary composition is maintained such that it is lattice-matched to the InP substrate.

In group III-V semiconductors, Al, Ga and In are group III elements, and P, As, and Sb are group V elements. These elements are well known as constituents of binary compound semiconductors such as GaAs, AlAs, InP, AlSb, GaSb, InAs, AlP, GaP, and InSb, as shown in FIG. 2. These six elements also theoretically, form many semiconductor alloys, i.e., eighteen ternary compounds, fifteen quaternary compounds, and six pentanary compounds. However in practical applications, the important ternary/quaternary heterostructures use InP, GaAs, InAs, or GaSb as a substrate.

The present invention discloses the improved and general method of growing heterostructures including group III-V semiconductors which are well lattice-matched to the substrate and which have a specified energy band gap. When a change in other physical characteristics is required other than lattice-matching and energy band gap, such as dielectric constant, etc., a pentanary epilayer is effective. In this case, two groups of effusion cells capable of growing two quaternary layers are provided in an MBE system. The pentanary layer is grown by alternately pulsing molecular beams from each group of the above-mentioned effusion cells for each quaternary semiconductor layer.

Further objects and advantages of the present invention will be apparent from the following description, reference being had to the accompanying drawings.

DETAILED DESCRIPTION OF THE PREFERRED EMBODIMENTS

In a first example according to the present invention, a method of growing a quaternary InGaAlAs alloy semiconductor lattice-matched to the InP substrate and having a specific energy band gap, is explained.

Figure 1:
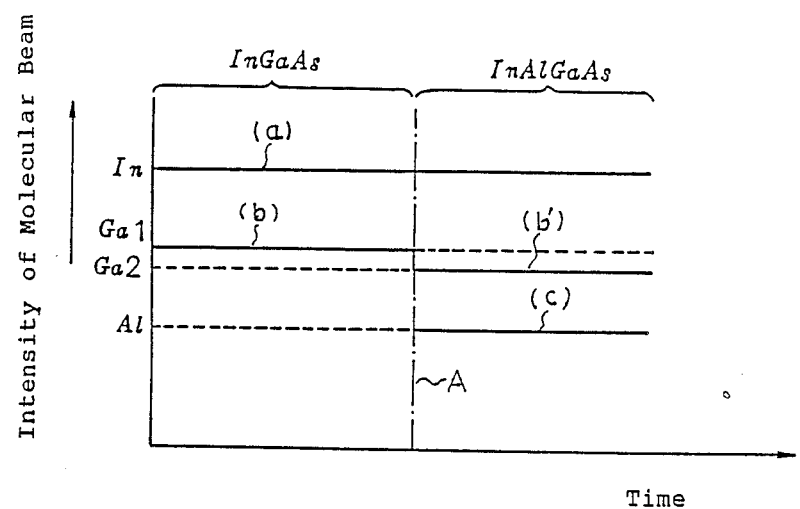
FIG. 1 is a plot of molecular beam intensity versus elapsed time when a ternary InGaAs semiconductor and a subsequent quaternary InAlGaAs semiconductor are grown forming a prior art heterostructure.
Figure 2:
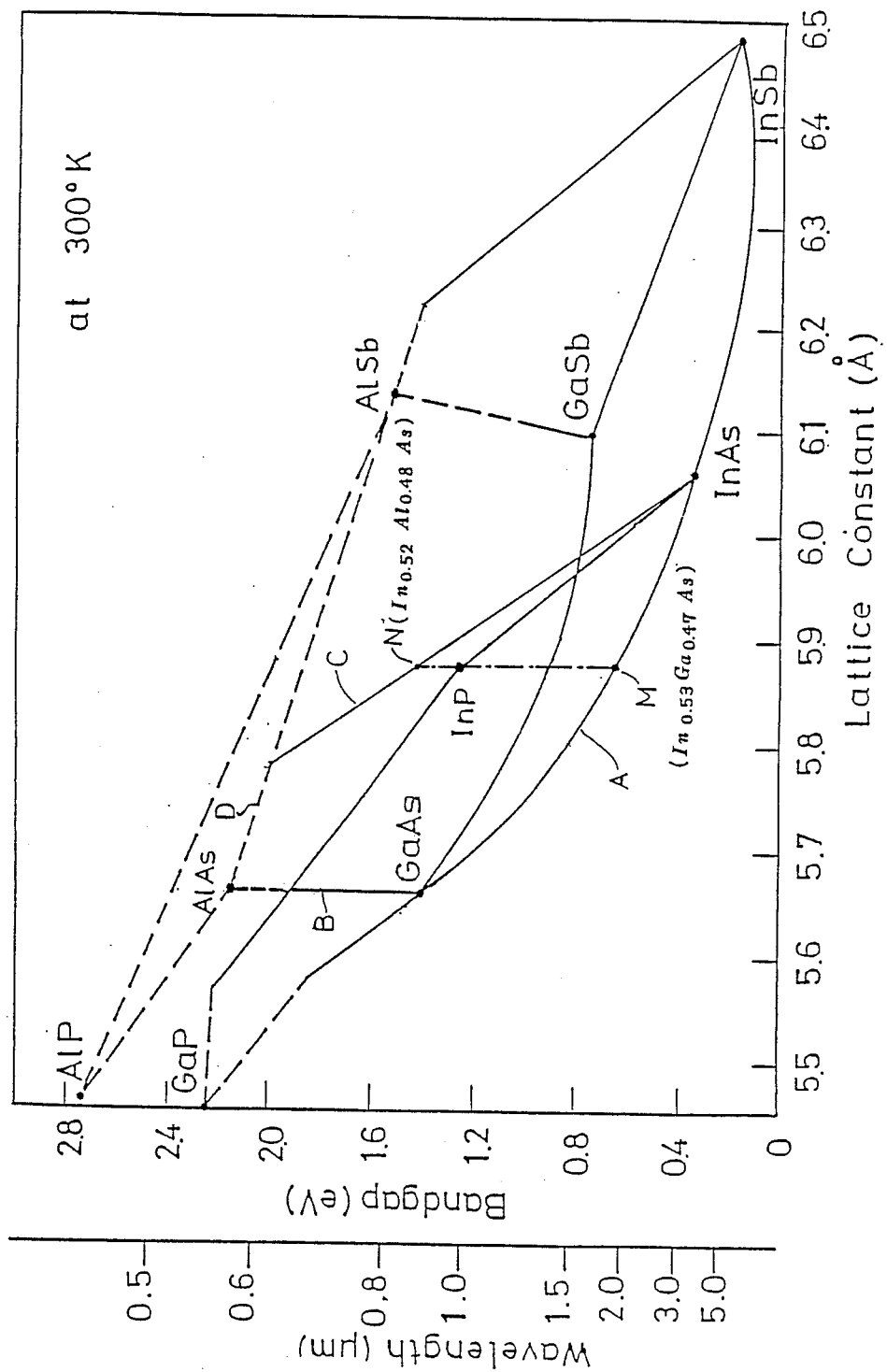
FIG. 2 is a plot of the lattice constant and energy band gap characteristics for group III-V binary and ternary semiconductors.

In the above-mentioned explanation regarding FIG. 2, it was set forth that both $In_{0.53}Ga_{0.47}As$ and $In_{0.52}Al_{0.48}As$ ternary semiconductors are well lattice-matched to an InP substrate. $In_{0.53}Ga_{0.47}As$ has an energy band gap of 0.75 eV and $In_{0.52}Al_{0.48}As$ has an energy band gap of 1.47 eV. A quaternary semiconductor InGaAlAs, lattice-matched to the InP substrate and having an energy band gap between those of $In_{0.53}Ga_{0.47}As$ and $In_{0.52}Al_{0.48}As$ ternary semiconductors, can be obtained when the composition of the quaternary semiconductor is given in the form of $m(In_{0.53}Ga_{0.47}As) + n(In_{0.52}Al_{0.48}As)$, where m and n determine the energy bandgap and are arbitrary numbers. In another expression using a form of $In_{1-(y+z)}Ga_yAl_zAs$, when the condition of $y+z=0.47\sim0.48$ is satisfied, the quaternary semiconductor InGaAlAs is lattice-matched to the InP substrate and has an energy band gap between 0.75 and 1.47 eV.

Therefore, in the present invention, since each Ga and Al beam intensity is adjusted with respect to that of In during a first step, i.e., x of $In_{1-x}Ga_xAs$ and $In_{1-x}Al_xAs$ is adjusted to $0.47\sim0.48$, respectively, the above condition $y+z=0.47\sim0.48$ is always satisfied even when the Ga and Al cell shutters are alternately switched during a second step.

Figure 3:
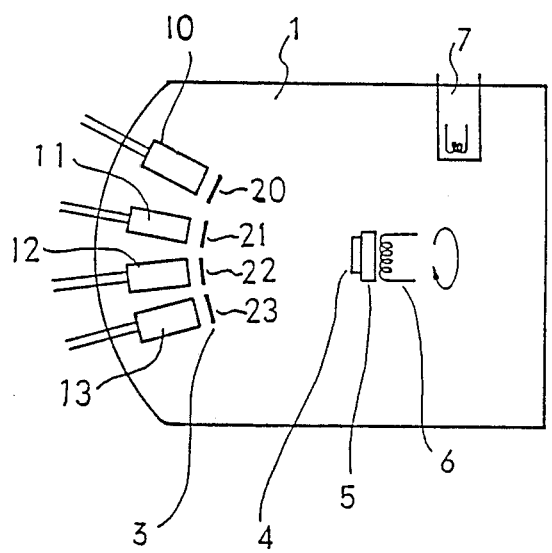
FIG. 3 is a cross-sectional view of an MBE system for growing a quaternary semiconductor according to the present invention.

FIG. 3 is a cross-sectional view of an MBE system used for growing the above-mentioned InGaAlAs. Four effusion cells 10, 11, 12 and 13, loaded in a furnace (not shown), are provided in a high vacuum chamber 1, each being used as a source of a molecular beam of In, Ga, Al, and As, respectively. The molecular beam intensity of each cell can be controlled by varying the temperature of the furnace. Each effusion cell also has a shutter (20 to 23, respectively). The shutter can be closed or opened, and thus each molecular beam can be controlled to be on and off.

The InP substrate 4 is fixed to a substrate holder 5, and the temperature of the substrate can be raised to a specified temperature by a heater 6. A quadrupole mass spectrometer 7 is provided for monitoring growth.

Before the growing process, the molecular beam intensities of In and Ga are adjusted so that a ternary semiconductor having a composition of $In_{0.53}Ga_{0.47}As$ is grown at a rate of 0.264 μm per hour under the conditions of $2\times10^{-5}$ Torr As pressure and a 500° C. substrate temperature. This growth rate is equivalent to the growth of one atomic layer per four seconds.

The molecular beam intensity of Al is then adjusted to grow a $In_{0.52}Al_{0.48}As$ ternary semiconductor using the same molecular beam intensity of In previously adjusted for $In_{0.53}Ga_{0.47}As$. The molecular beam intensity of As is surplus.

Figure 4:
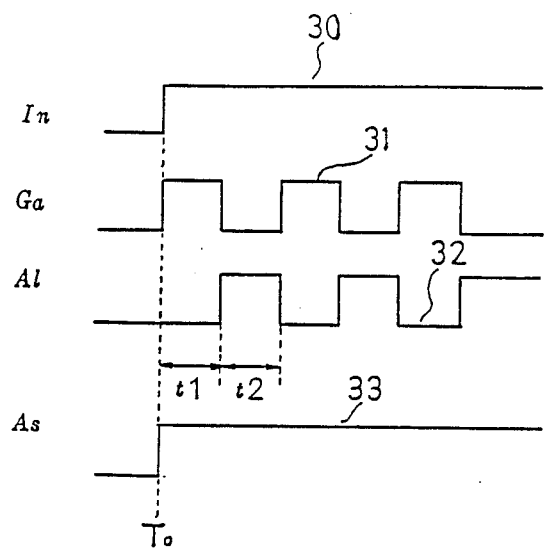
FIG. 4 is a timing diagram of the on and off state of each shutter for four effusion cells during the growth of a quaternary semiconductor according to the present invention.

The shutter operating times are shown in the timing diagram of FIG. 4, where the abscissa shows the elapsed time of growth. Each shutter of each effusion cell is shown designating when the shutter is opened and is closed. The reference numbers 30 through 33 correspond to the operation of effusion cells In, Ga, Al, and As, respectively. Shutters of In and As effusion cells 10 and 13 are always open during growth. When the growth of quaternary InGaAlAs beings at $T_0$ in FIG. 4, three effusion cells, In, Ga, and As, deposit molecules on the substrate 4 during a time period $t_1$. Thereafter, the shutter 21 for Ga is closed and the shutter 22 for Al is opened for a time period $t_2$. This process is repeated a number of times until the necessary thickness of the quaternary semiconductor is obtained.

When the time periods $t_1$ and $t_2$ are chosen as two seconds each, then each time period corresponds to the formation of one-half an atomic layer since the beam intensities are adjusted so as to form one monolayer per four seconds as described before. This results in continuous alloy growth of the quaternary semiconductor InGaAlAs which is lattice-matched to the InP substrate.

If the thickness of each composite layer (InGaAs or InAlAs) becomes thicker than that of three atomic layers, each composite layer does not exhibit the properties of the quaternary alloy layer any longer, but exhibits the properties of a superlattice structure.

Even though the time periods $t_1$ and $t_2$ are not very critical, a growth time for growing less than three atomic layers is practical (one atomic layer or less is preferable).

When the time period for growing $In_{0.53}Ga_{0.47}As$ is almost equal to that of $In_{0.52}Al_{0.48}As$, the quaternary semiconductor InGaAlAs has an energy band gap approximately equal to the energy band gap between the two ternary semiconductors ($In_{0.53}Ga_{0.47}As$ and $In_{0.52}Al_{0.48}As$). The grown quaternary semiconductor InGaAlAs is more commonly expressed in the form $(In_{0.53}Ga_{0.47}As)_{\frac{1}{2}}(In_{0.52}Al_{0.48}As)_{\frac{1}{2}}$, rather than in the form of $In_{0.525}Ga_{0.235}Al_{0.024}As$.

When the time periods $t_1$ and $t_2$ are changed such that $t_1$ is equal to one second and $t_2$ is equal to three seconds, then the following quaternary semiconductor can be obtained:

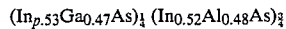

$(In_{p.53}Ga_{0.47}As)_{\frac{1}{4}}(In_{0.52}Al_{0.48}As)_{\frac{3}{4}}$

In a similar manner when the time periods $t_1$ and $t_2$ are selected to be three seconds and one second, respectively, the following quaternary semiconductor is formed:

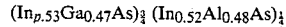

$(In_{p.53}Ga_{0.47}As)_{\frac{3}{4}}(In_{0.52}Al_{0.48}As)_{\frac{1}{4}}$

It is easily understood that when a ratio $t_1/t_2$ increases, the energy band gap of the grown quaternary semiconductor approaches that of $In_{0.53}Ga_{0.47}As$. Therefore, by controlling the time periods $t_1$ and $t_2$, a quaternary semiconductor InGaAlAs, having an energy band gap between 0.75 and 1.47 eV can be obtained.

The above method is easily applied to form ternary/quaternary or quaternary/ternary heterostructures. When the time period $t_1$ or $t_2$ is long enough, the ternary semiconductors $In_{0.53}Ga_{0.47}As$ or $In_{0.52}Al_{0.48}As$ can be grown.

Figure 5:
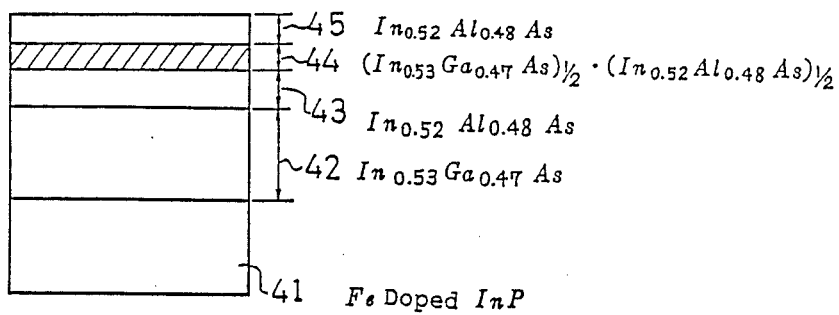
FIG. 5 is a cross-sectional view of a multi-heterostructure comprising a InGaAlAs quaternary semiconductor grown on an InP substrate according to the present invention.

FIG. 5 is a cross-section of a multi-heterostructure, wherein an $In_{0.53}Ga_{0.47}As$ layer 42 (0.6 $\mu$m) is formed on a Fe doped InP substrate, an $In_{0.52}Al_{0.48}As$ layer 43 (0.2 $\mu$m) is grown on the layer 42, a quaternary semiconductor $(In_{0.53}Ga_{0.47}As)_{\frac{1}{2}}(In_{0.52}Al_{0.48}As)_{\frac{1}{2}}$ layer 44 (200 Å) is grown on the layer 43, and an $In_{0.52}Al_{0.48}As$ layer 45 (0.2 $\mu$m) is grown on the layer 44 to form a quantum-well.

In growing the above structure, the MBE system of FIG. 3 can be employed. The $In_{0.53}Ga_{0.47}As$ layer 42 is first formed using effusion cells 10, 11, and 13 for growing In, Ga, and As, respectively. Next, the shutter of the Ga effusion cell 11 is closed and the shutter of the Al effusion cell 12 is opened. Then the $In_{0.52}Al_{0.48}As$ layer 43 begins to grow. After the growth of layer 43, the quaternary semiconductor InGaAlAs layer 44 is grown in accordance with the present invention by opening and closing the shutters 21 and 22 alternately as explained previously with respect to FIG. 4. After the growth of quaternary semiconductor layer 44, the ternary semiconductor $In_{0.52}Al_{0.48}As$ layer 45 is grown.

Figure 6:
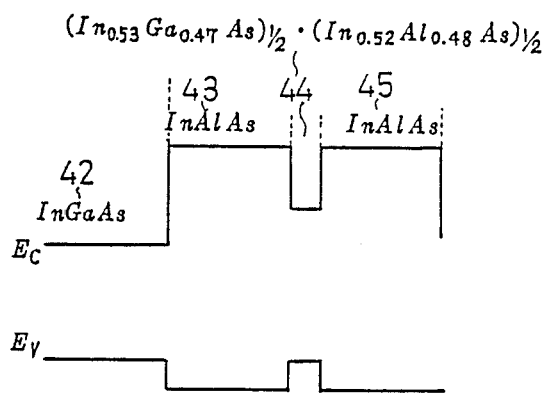
FIG. 6 is an energy band diagram of an energy band gap of the epitaxial layers shown in FIG. 5.

FIG. 6 is an energy diagram of the energy band gap of the structure of FIG. 5. The $(In_{0.53}Ga_{0.47}As)_{\frac{1}{2}}(In_{0.52}Al_{0.48}As)_{\frac{1}{2}}$ quaternary semiconductor layer 44 sandwiched by two ternary semiconductor $In_{0.52}Al_{0.48}As$ layers 43 and 45 form a quantum-well.

Figure 7:
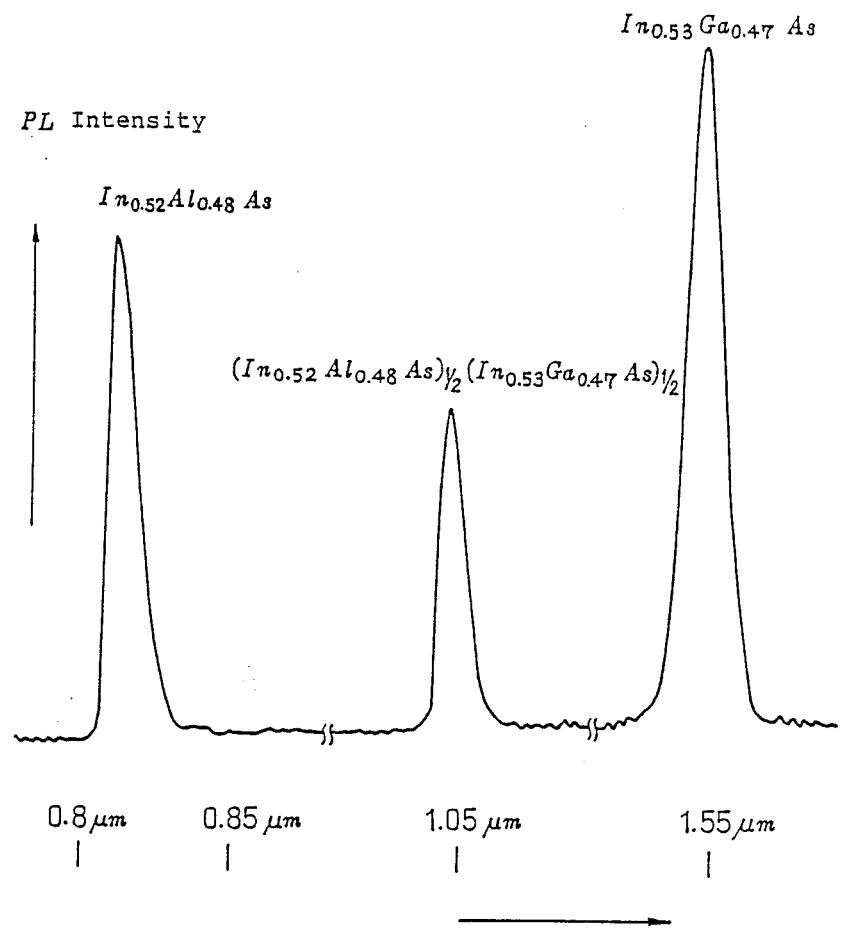
FIG. 7 is a graph of test results of a PL (photoluminescent) measurement of the epitaxial layers shown in FIG. 5, grown according to the method of the present invention.

FIG. 7 shows test results of the above quantum-well by a PL (photoluminescence) measurement at 4.2° K. (Kelvin). At the middle portion along the abscissa between the two peaks indicating $In_{0.52}Al_{0.48}As$ and $In_{0.53}Ga_{0.47}As$ PL intensities (i.e., at 0.82 $\mu$m and 1.55 $\mu$m, respectively), the peak for the $(In_{0.53}Ga_{0.47}As)_{\frac{1}{2}}(In_{0.52}Al_{0.48}As)_{\frac{1}{2}}$ layer can be observed (i.e., at approximately 1.05 $\mu$m). This shows that the quaternary semiconductor layer is grown.

When the growing process for each layer 44 and 45 is repeated a number of times and the thickness of each layer is chosen to be approximately 30 to 50 Å, respectively, a multi-quantum-well is formed.

The first example discussed above comprises group III elements Al, Ga, and In, and the group V element As. When growing III-V quaternary semiconductors, many combinations of group III-V elements can be expected. In addition, group V elements P and Sb can be used instead of As.

Among group III elements, Al and Ga elements are closely related in that the two elements have a similar atomic radius. This is also understood by FIG. 2 which shows that each of the three groups of binary compound semiconductors AlP and GaP, AlAs and GaAs, and AlSb and GaSb, have almost the same lattice constant but have different energy band gaps. Therefore, the use of two ternary semiconductors, one comprising Al and the other Ga, is very convenient for growing quaternary semiconductor lattice-matched devices.

Except for the growth of the quaternary semiconductor InGaAlAs already explained, three kinds of quaternary semiconductors can be grown by modifying the method for an InGaAlAs growth and are explained hereinafter.

InGaAlP can be grown using two ternary semiconductors of InGaP and InAlP lattice-matched to a GaAs substrate. This means four effusion cells of In, P, Ga and Al are used, and each beam intensity of Ga and Al is adjusted to the intensity to obtain InGaP and InAlP lattice-matched to a GaAs substrate. InGaAlP is grown by alternately opening and closing the cell shutters of Ga and Al and by continuously radiating the In and P molecular beams.

AlGaAsSb can be grown using two ternary semiconductors of AlAsSb and GaAsSb lattice-matched to an InP substrate. In this example, first the As and Sb beam intensities are adjusted so that the two ternary semiconductors are lattice-matched to the InP substrate. Then, the cell shutters of Ga and Al are alternately opened and closed and the As and Sb beam intensities are kept constant.

AlGaPSb can be grown using two ternary semiconductors of AlPSb and GaPSb lattice-matched to an InP or GaAs substrate. In this example, the P and Sb beam intensities are adjusted so that the two ternary semiconductors are lattice-matched to the InP substrate. Then, the cell shutters of Ga and Al are alternately opened and closed, and the P and Sb beam intensities are kept constant.

InGaAlSb can be grown using two ternary semiconductors of InGaSb and InAlSb lattice-matched to a possible ternary substrate in the same manner as set forth above.

AlGaPAs can be grown using two ternary semiconductors of GaPAs and APAs lattice-matched to a possible ternary substrate in the same manner as set forth above.

The embodiments disclosed above relate to a method of growing quaternary semiconductors lattice-matched to a substrate and having a specified energy band gap. The present invention can be extended to a method of growing a pentanary semiconductor lattice-matched to a binary compound substrate and having a specified energy band gap.

Pentanary semiconductors have advantages of permitting independent variations in physical characteristics of the device such as the dielectric constant, the index of refraction, etc.

In growing a pentanary semiconductor, five effusion cells are provided in an MBE system. For example, when growing a pentanary semiconductor, InGaAlAsSb, effusion cells of In, Ga, Al, As, and Sb are provided. Two groups of four effusion cells (i.e., a group of In, Ga, As, Sb cells and a group of In, Al, As, Sb cells, where In, As, Sb are common to each group of effusion cells) are used to generate pulsed molecular beams. Each group is capable of growing a quaternary semiconductor lattice-matched to a substrate. One group includes an Al cell and the other group includes a Ga cell, as in the case of growing a quaternary semiconductor.

Preferably, all the effusion cells except for the Al and Ga effusion cells are commonly provided and only the Al and Ga cell shutters are alternately opened and closed. In a first procedure, the Ga and Al beam intensities are adjusted with respect to the In beam, and the As beam intensity is adjusted with respect to the Sb beam so as to form InGaAsSb and InAlAsSb lattice-matched to the InP substrate, respectively. In a second procedure, shutters of Al and Ga cells are alternately opened and closed while keeping the remaining beam intensities constant. During the growth of pentanary semiconductors, shutters for the effusion cells In, As, and Sb are always opened and the shutters for the effusion cells Ga and Al are opened and closed alternately. This is similar to that explained above with respect to growing a quaternary semiconductor (the time period of each pulse (i.e., the opened and closed state of the Ga and Al shutters) is also less than the growth time for three atomic layers). Molecular beams capable of forming two quaternary semiconductors InGaAsSb and InAlAsSb are pulsed alternately, and the pentanary semiconductor InGaAlAsSb is grown on the substrate. Binary compound semiconductors such as InP, InAs, or GaSb can be used as the growth substrate.

The method for growing the other three pentanary semiconductors is similar to that set forth above and is disclosed as follows.

InGaAlAsP can be grown using two quaternary semiconductors, InGaAsP and InAlPAs lattice-matched to a GaAs or InP substrate. InGaAlPSb can be grown using two quaternary semiconductors InGaPSb and InAlPSb lattice-matched to a GaAs, InP, InAs, or GaSb substrate. GaAlPAsSb can be grown using two quaternary semiconductors GaPAsSb and AlPAsSb lattice-matched to a GaAs, InP, or InAs substrate.

Although only several embodiments of the invention have been disclosed and described, it is apparent that numerous embodiments and modifications will readily occur to those skilled in the art and it is not desired to limit the invention to the exact construction, method and application shown and described, and accordingly, all suitable modifications and equivalents may be resorted to, falling within the scope of the invention and the appended claims and their equivalents.

What is claimed is:

1. A method of growing a group III-V quaternary alloy semiconductor InGaAlAs having a lattice constant substantially the same as that of a binary semiconductor substrate InP by a molecular beam epitaxy (MBE) process, said method comprising the steps of:

(a) providing four effusion cells of In, Ga, Al, and As;
   (b) adjusting each molecular beam intensity of the In and As effusion cells and one of the Ga and Al effusion cells of a first group by changing a temperature of each effusion cell such that an operation of the first group of In and As and one of the Ga and Al effusion cells grows a ternary semiconductor of one of InGaAs and InAlAs, which satisfies a condition of having substantially the same lattice constant as that of the InP substrate, and adjusting a remaining molecular beam intensity of the other one of Ga and Al effusion cells by changing a temperature of the effusion cell, while maintaining each molecular beam intensity of the first group of effusion cells such that an operation of a second group of the In and As and the other one of the Ga and Al effusion cells grows a ternary semiconductor of the other one of InGaAs and InAlAs which satisfies the conditon of having substantially the same lattice constant as that of the InP substrate;
   (c) operating only the first group of effusion cells by opening one of the Ga and Al effusion cells and closing the other one of the Ga and Al effusion cells and opening the other two In and As effusion cells for a first growth period which is less than or equal to the time required to grow three atomic layers;
   (d) operating only the second group of effusion cells by opening the other one of the Ga and Al effusion cells and closing the one of the Ga and As effusion cells and maintaining the other two of the In and As effusion cells open for a second growth period which is less than or equal to the time required to grow three atomic layers; and
   (e) repeating said steps (c) and (d) without interruption, simultaneously resulting in growing the quaternary semiconductor InGaAlAs having substantially the same lattice constant as that of the InP substrate until a necessary thickness on the InP substrate is obtained.

2. A method of growing a group III-V quaternary alloy semiconductor InGaAlP having a lattice constant substantially the same as that of a binary semiconductor substrate GaAs by a molecular beam epitaxy (MBE) process, said method comprising the steps of:

(a) providing four effusion cells of In, Ga, Al, and P;
   (b) adjusting each molecular beam intensity of the In and P and one of the Ga and Al effusion cells of a first group by changing a temperature of each effusion cell such that an operation of the first group of In and P and one of the Ga and Al effusion cells grows a ternary semiconductor of one of InGaP and InAlP which satisfies a condition having substantially the same lattice constant as that of the GaAs substrate and adjusting a remaining molecular beam intensity of the other one of the Ga and Al effusion cells by changing a temperature of the effusion cell, while maintaining each molecular beam intensity of the first group of effusion cells as adjusted such that a second operation of a second group of In and P effusion cells and the other one of the Ga and Al effusion cells grows a ternary semiconductor of the other one of InGaP and InAlP which satisfies the condition of having substantially the same lattice constant as that of the GaAs substrate, respectively, each being lattice-matched to the substrate;

(c) operating only the first group of effusion cells by opening one of the Ga and Al effusion cells and closing the other one of the Ga and Al effusion cells and opening the other two In and P effusion cells for a first growth period which is less than or equal to the time required to grow three atomic layers;

(d) operating only the second group of effusion cells by opening the other one of the Ga and Al effusion cells and closing the one of the Ga and Al effusion cells and maintaining the In and P effusion cells open for a second growth period which is less than or equal to the time required to grow three atomic layers; and (e) repeating said steps (c) and (d) without interruption, simultaneously resulting in growing the quaternary semiconductor InGaAlP having substantially the same lattice constant as that of the GaAs substrate until a necessary thickness on the InP substrate is obtained.

3. A method of growing a group III-V quaternary alloy semiconductor AlGaAsSb having a lattice constant substantially the same as that of a binary semiconductor substrate InP by a molecular beam epitaxy (MBE) process, said method comprising the steps of:

(a) providing four effusion cells of Al, Ga, As and Sb;

(b) adjusting each molecular beam intensity of the As and Sb effusion cells and one of the Ga and Al effusion cells of a first group by changing a temperature of each effusion cell such that an operation of the first group of As and Sb effusion cells and one of the Ga or Al diffusion cells grows a ternary semiconductor of one of AlAsSb and GaAsSb which satisfies a condition of having substantially the same lattice constant as that of the InP substrate and adjusting a remaining molecular beam intensity of the other one of the Ga and Al effusion cells by changing a temperature of the effusion cell, while maintaining each molecular beam intensity of the first group of effusion cells such that another operation of a second group of the As and Sb effusion cells and the other one of the Ga and Al effusion cells grow a ternary semiconductor of one of GaAsSb and AlAsSb which satisfies the condition of having substantially the same lattice constant as that of the InP substrate;

(c) operating only the first group of effusion cells by opening one of the Ga and Al effusion cells and closing the other one of the Ga and Al effusion cells while opening the As and Sb effusion cells for a first growth period which is less than or equal to the time required to grow three atomic layers;

(d) operating only the second group of effusion cells by opening the other one of the Ga and Al effusion cells and closing the open one of the Ga and Al effusion cells while maintaining the As and Sb effusion cells open for a second growth period which is less than or equal to the time required to grow three atomic layers; and (e) repeating said steps (c) and (d) without interruption, simultaneously resulting in growing a quaternary semiconductor AlGaAsSb having substantially the same lattice constant as that of the InP substrate until a necessary thickness on the InP substrate is obtained.

4. A method of growing a group III-V quaternary alloy semiconductor AlGaPSb having a lattice constant substantially the same as that of a binary semiconductor substrate selected from a group of InP and GaAs by a molecular beam epitaxy (MBE) process, said method comprising the steps of:

(a) providing four effusion cells of Al, Ga, P, and Sb;

(b) adjusting each molecular beam intensity of the P and Sb effusion cells and one of the Ga and Al effusion cells of a first group by changing a temperatue of each effusion cell such that an operation of the first group of P and Sb effusion cells and one of Ga and Al effusion cells grows one of a ternary semiconductor of GaPSb and AlPSb which satisfies a condition of having substantially the same lattice constant as that of one of the InP and GaAs substrate, and adjusting a remaining molecular beam intensity of the other one of the Ga and Al effusion cells by changing a temperature of the effusion cells, while maintaining the molecular beam intensity of the first group of effusion cells such that an operation of the second group of P and Sb effusion cells and the other one of the Ga and Al effusion cells grows one of a ternary semiconductor of AlPSb and GaPSb which satisfies the condition of having substantially the same lattice constant as that of the InP and GaAs substrate;

(c) operating only the first group of effusion cells by opening the one of the Ga and Al effusion cells and closing the other one of the Ga and Al effusion cells while opening the P and Sb effusion cells for a first growth period which is less than or equal to the time required to grow three atomic layers;

(d) operating only the second group of effusion cells by opening the other one of the Ga and Al effusion cells and closing the one of the Ga and Al effusion cells while maintaining the P and Sb effusion cells open for a second growth period which is less than or equal to the time required to grow three atomic layers; and (e) repeating said steps (c) and (d) without interruption, simultaneously resulting in growing the quaternary semiconductor AlGaPSb having substantially the same lattice constant as that of one of the InP and GaAs substrate until a necessary thickness on the InP substrate is obtained.

5. A method of growing a group III-V quaternary alloy semiconductor according to claim 1, further comprising a step of changing the first and second growth periods in said steps (c) and (d) for growing a quaternary semiconductor having a different composition.

6. A method of growing a group III-V quaternary alloy semiconductor according to claim 2, further comprising a step of changing the first and second growth periods in said steps (c) and (d) for growing a quaternary semiconductor having a different composition.

7. A method of growing a group III-V quaternary alloy semiconductor according to claim 3, further comprising a step of changing the first and second growth periods in said steps (c) and (d) for growing a quaternary semiconductor having a different composition.

8. A method of growing a group III-V quaternary alloy semiconductor according to claim 4, further comprising a step of changing the first and second growth periods in said steps (c) and (d) for growing a quaternary semiconductor having a different composition.

9. A method of growing a group III-V quaternary alloy semiconductor according to claim 5, wherein the first and second growth periods in said steps (c) and (d) have a ratio determined by an energy band gap of the growing quaternary semiconductor layer, the energy band gap having a specified value between the first and second ternary semiconductors grown in said step (b).

10. A method of growing a group III-V quaternary alloy semiconductor according to claim 6, wherein the first and second growth periods in said steps (c) and (d) have a ratio determined by an energy band gap of the growing quaternary semiconductor layer, the energy band gap having a specified value between the first and second ternary semiconductors grown in said step (b).

11. A method of growing a group III-V quaternary alloy semiconductor according to claim 7, wherein the first and second growth periods in said steps (c) and (d) have a ratio determined by an energy band gap of the growing quaternary semiconductor layer, the energy band gap having a specified value between the first and second ternary semiconductors grown in said step (b).

12. A method of growing a group III-V quaternary alloy semiconductor according to claim 8, wherein the first and second growth periods in said steps (c) and (d) have a ratio determined by an energy band gap of the growing quaternary semiconductor layer, the energy band gap having a specified value between the first and second ternary semiconductors grown in said step (b).

13. A method of growing a group III-V pentanary alloy semiconductor lattice-matched to a substrate of a group III-V binary compound semiconductor by a molecular beam epitaxy (MBE) process, said method comprising the steps of:
(a) providing three effusion cells selected from a group consisting of In, P, As, and Sb, and providing effusion cells of Ga and Al;
(b) adjusting molecular beam intensities of the three effusion cells and the Ga effusion cells, the quaternary semiconductor formed from the three effusion cells and the Ga effusion cell being lattice-matched to the substrate;
(c) adjusting molecular beam intensities of the three effusion cells and the Al effusion cell, the quaternary semiconductor formed from the three effusion cells and the Al effusion cell being lattice-matched to the substrate, whereby the molecular beam intensities for the three effusion cells are the same as those in said step (b); and
(d) continuously radiating molecular beams from the three effusion cells, and alternately opening and closing shutters of the Ga and Al effusion cells.

14. A method of growing a group III-V pentanary alloy semiconductor according to claim 13, wherein said step (d) comprises opening the shutters of the Ga and Al effusion cells for a time less than that required to grow three atomic layers.

* * * * *